(12) United States Patent
Fermon et al.

(10) Patent No.: US 12,174,145 B2
(45) Date of Patent: Dec. 24, 2024

(54) DEVICE AND METHOD FOR MAGNETICALLY DETECTING MICROSCOPIC BIOLOGICAL OBJECTS

(71) Applicant: COMMISSARIAT À L'ÉNERGIE ATOMIQUE ET AUX ÉNERGIES ALTERNATIVES, Paris (FR)

(72) Inventors: Claude Fermon, Gif sur Yvette (FR); Manon Giraud, Gif sur Yvette (FR); Francois-Damien Delapierre, Gif sur Yvette (FR); Guenaelle Jasmin, Gif sur Yvette (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 1045 days.

(21) Appl. No.: 17/252,092

(22) PCT Filed: Jun. 13, 2019

(86) PCT No.: PCT/EP2019/065560
§ 371 (c)(1),
(2) Date: Dec. 14, 2020

(87) PCT Pub. No.: WO2019/238857
PCT Pub. Date: Dec. 19, 2019

(65) Prior Publication Data
US 2021/0255143 A1    Aug. 19, 2021

(30) Foreign Application Priority Data

Jun. 14, 2018   (FR) ...................................... 1855217

(51) Int. Cl.
*G01N 27/74*    (2006.01)
*G01R 33/12*    (2006.01)

(52) U.S. Cl.
CPC ....... *G01N 27/745* (2013.01); *G01R 33/1269* (2013.01)

(58) Field of Classification Search
CPC .......................... G01N 27/745; G01R 33/1269
See application file for complete search history.

(56) References Cited

U.S. PATENT DOCUMENTS

| 6,522,910 | B1 * | 2/2003 | Gregory | ................. G01N 27/24 |
| | | | | 600/509 |
| 7,603,251 | B1 * | 10/2009 | Wiegert | ............... G01R 33/022 |
| | | | | 702/152 |

(Continued)

FOREIGN PATENT DOCUMENTS

CN      106370842 B    12/2017

OTHER PUBLICATIONS

International Search Report as issued in International Patent Application No. PCT/EP2019/065560, dated Aug. 23, 2019.

(Continued)

*Primary Examiner* — P. Kathryn Wright
*Assistant Examiner* — Curtis A Thompson
(74) *Attorney, Agent, or Firm* — Pillsbury Winthrop Shaw Pittman LLP

(57) ABSTRACT

A device for magnetically detecting microscopic biological objects includes a microfluidic channel having a fluid inlet and a fluid outlet; a plurality of magnetic sensors arranged against an inner wall of the microfluidic channel; and a permanent magnet arranged against an outer wall of the microfluidic channel, in such a way that the plurality of magnetic sensors is immersed in a magnetic field created by the permanent magnet; the plurality of magnetic sensors including a first magnetic sensor; a second magnetic sensor opposite the first magnetic sensor; a third magnetic sensor downstream of the first and second magnetic sensors.

11 Claims, 7 Drawing Sheets

(56) References Cited

U.S. PATENT DOCUMENTS

| | | | | |
|---|---|---|---|---|
| 2002/0060565 A1* | 5/2002 | Tondra | ............... | G01R 33/1269 |
| | | | | 324/260 |
| 2006/0081954 A1* | 4/2006 | Tondra | .................... | G01V 3/08 |
| | | | | 257/421 |
| 2014/0295460 A1* | 10/2014 | Weissleder | ....... | G01N 33/56916 |
| | | | | 422/69 |

OTHER PUBLICATIONS

Kokkinis, G., et al., "Magnetic-based biomolecule detection using giant magnetoresistance sensors," Journal of Applied Physics, vol. 117, No. 17, May 2015, XP012196407, 4 pages.

Zhu, C., et al., "A micro-array bio detection system based on a GMR sensor with a 50-ppm sensitivity," Science China Information Sciences, vol. 60, No. 8, Apr. 2017, XP036227520, 9 pages.

* cited by examiner

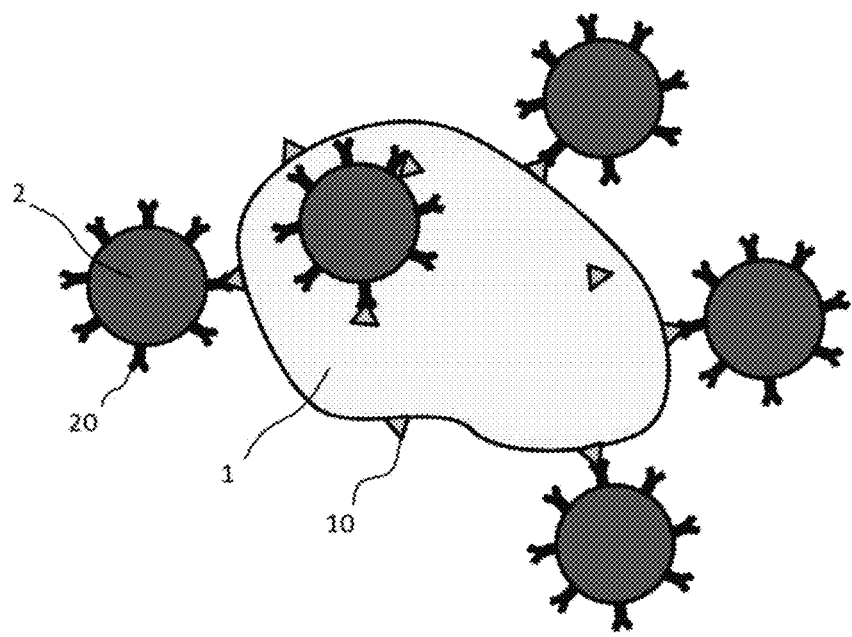
Fig. 1a – Prior art
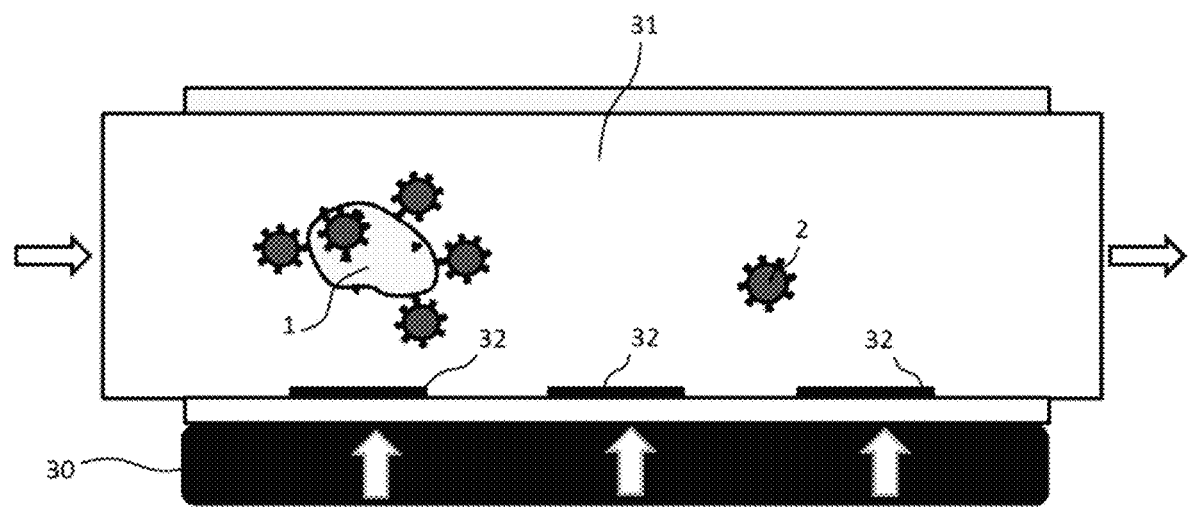
Fig. 1b – Prior art

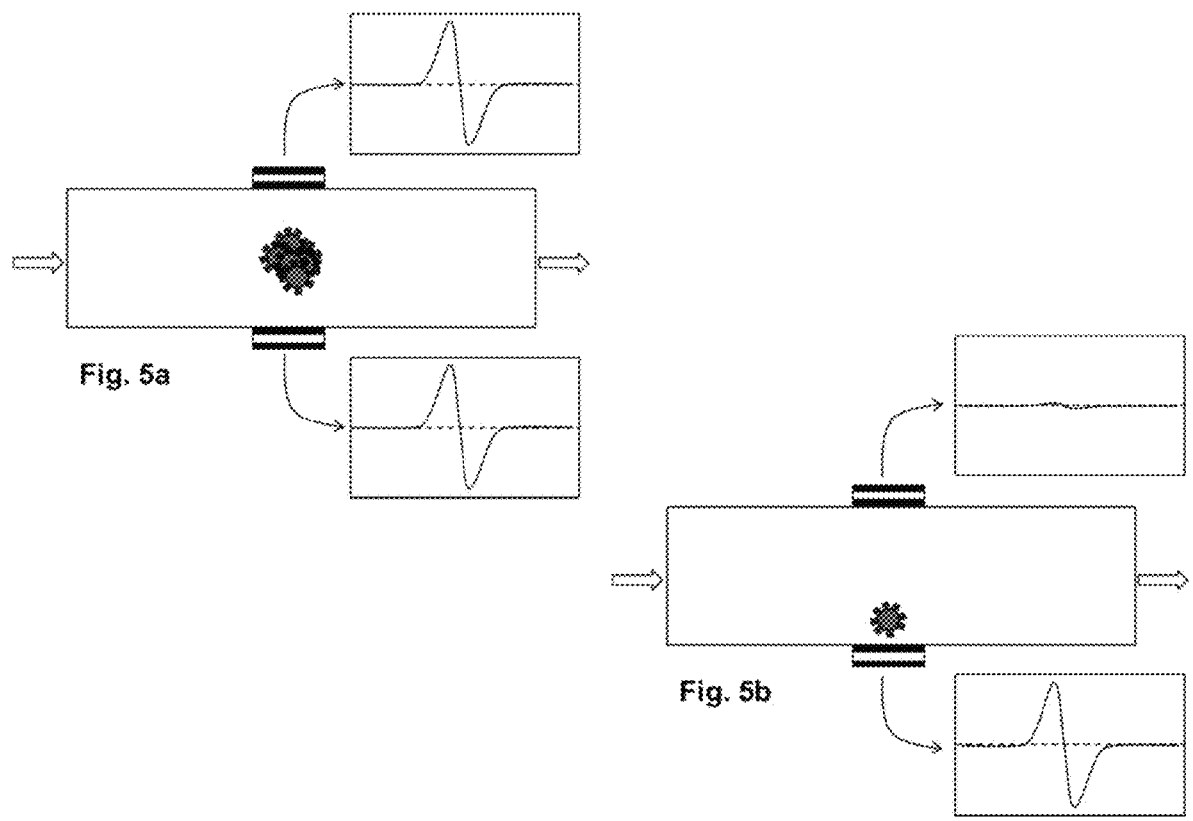
Fig. 5a
Fig. 5b
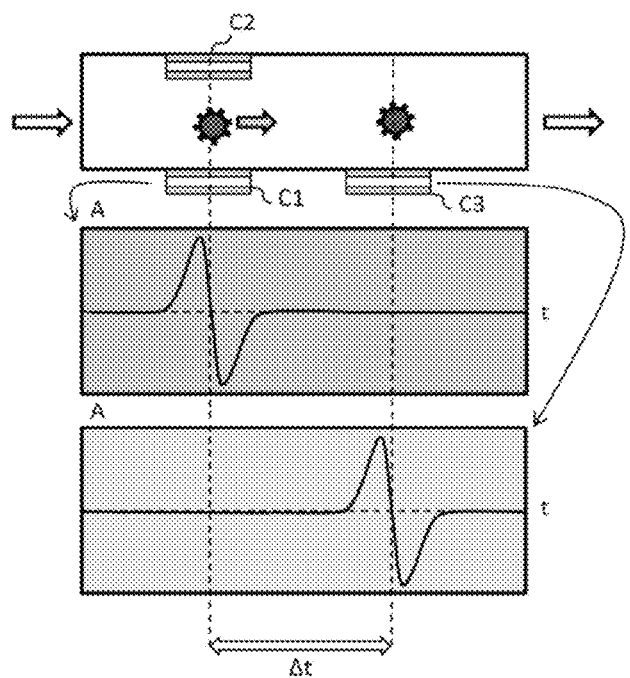
Fig. 6

DEVICE AND METHOD FOR MAGNETICALLY DETECTING MICROSCOPIC BIOLOGICAL OBJECTS

CROSS-REFERENCE TO RELATED APPLICATIONS

This application is the U.S. National Stage of PCT/EP2019/065560, filed Jun. 13, 2019, which in turn claims priority to French patent application number 1855217 filed Jun. 14, 2018. The content of these applications are incorporated herein by reference in their entireties.

TECHNICAL FIELD OF THE INVENTION

The field of the invention is that of the detection of small biological objects.

The invention more specifically pertains to a device for magnetically detecting microscopic biological objects, such as cells, bacteria or proteins.

PRIOR ART

In the field of the detection of microscopic biological objects, flow cytometry is a known technique according to which particles to detect are solubilised in a fluid and circulate in a fluidic channel passing into the beam of a laser. On passing into this beam, the particles absorb then reemit light: it is this reemitted light that makes it possible to detect them. Flow cytometry requires however complex instrumentation.

Much research is oriented towards a magnetic and no longer optical detection technique. To do so, as illustrated in FIGS. 1a and 1b, magnetic nanoparticles 2 are attached to the objects 1 to detect in order to serve as markers and the objects 1 thus marked are detected by magnetic sensors 32. In order that the magnetic nanoparticles 2 can attach themselves to the objects 1 to detect, they are generally themselves marked with specific antibodies 20 able to fasten onto receivers 10 of the objects 1 to detect. The larger is the size of an object 1 to detect, the more it can accommodate receivers 10 on which magnetic nanoparticles 2 come to be attached and thus the more its magnetic moment is liable to be large. The objects 1 to detect thus marked are next made to circulate in a microfluidic channel 31 under which are arranged a permanent magnet 30 and magnetic sensors 32.

To date, this magnetic detection approach has been applied with success to the detection of cells but has proved very difficult for the detection of bacteria and infructuous for the detection of proteins.

A solution is thus sought making it possible to detect microscopic biological objects, including bacteria and proteins, by a magnetic and non-optical detection technique.

DESCRIPTION OF THE INVENTION

In this context, an aspect of the invention relates to a device for magnetically detecting microscopic biological objects comprising:
- a microfluidic channel extending between a first upstream end and a second downstream end, the microfluidic channel having an inlet suited for a fluid on the side of its first upstream end and an outlet suited for a fluid on the side of its second downstream end, the microfluidic channel having a length in a first direction of flow, a width in a second direction perpendicular to the first direction and a height in a third direction perpendicular to the first and second directions;
- a plurality of magnetic sensors arranged against an inner wall of the microfluidic channel; and
- a permanent magnet arranged against an outer wall of the microfluidic channel, in such a way that the plurality of magnetic sensors is immersed in a magnetic field created by the permanent magnet;

the plurality of magnetic sensors comprising:
- a first magnetic sensor;
- a second magnetic sensor opposite the first magnetic sensor in such a way that the first and second magnetic sensors are aligned parallel to the third direction;
- a third magnetic sensor arranged in such a way that the first and third magnetic sensors are aligned parallel to the first direction and/or a fourth magnetic sensor arranged in such a way that the second and fourth magnetic sensors are aligned parallel to the first direction; the third and fourth magnetic sensors being arranged downstream of the first and second magnetic sensors;
- a data processing system configured to determine a velocity of an object detected from the time elapsed between two detections of a relevant event by two sensors aligned parallel to the first direction and to determine a height of an object detected from the ratio of the signals emitted by at least one pair of opposite sensors.

The first and second magnetic sensors arranged on either side of the microfluidic channel make it possible to know, by a ratio of their measurements and independently of any knowledge or hypothesis on the magnetic moment of the object detected, at what channel height each object detected is found in order to distinguish the signal of a small close object from that of a large object further away. The third and/or fourth magnetic sensors downstream of the first and second magnetic sensors make it possible to determine the flow velocity of the object detected.

Apart from the main characteristics that have been described, the device for magnetically detecting biological objects according to an aspect of the invention may have one or more complementary characteristics among the following, considered individually or according to all technically possible combinations thereof:

- The magnetic field is colinear to the third direction. A field colinear to the third direction makes it possible to avoid the field being planar, that is to say that the field lines are colinear to the first direction, which would have the consequence of saturating the sensors, or that the field lines are colinear to the second direction, which would reduce the sensitivity of the sensors. Preferentially, the component of the magnetic field along the first direction and the component of the magnetic field along the second direction have values below 1 millitesla.
- The plurality of magnetic sensors comprises the third magnetic sensor and the fourth magnetic sensor, the third and fourth magnetic sensors being aligned parallel to the third direction.
- The plurality of magnetic sensors comprises a fifth magnetic sensor arranged in such a way that the first and fifth magnetic sensors are aligned parallel to the first direction and/or a sixth magnetic sensor arranged in such a way that the second and sixth magnetic sensors are aligned parallel to the first direction; the fifth and sixth magnetic sensors being arranged downstream of the third and fourth magnetic sensors.

The plurality of magnetic sensors comprises the fifth magnetic sensor and the sixth magnetic sensor, the fifth and sixth magnetic sensors being aligned parallel to the third direction.

The plurality of magnetic sensors comprises:
- a seventh magnetic sensor arranged in such a way that the first and seventh magnetic sensors are aligned parallel to the second direction, and
- an eighth magnetic sensor arranged in such a way that the second and eighth magnetic sensors are aligned parallel to the second direction and that the seventh and eighth magnetic sensors are aligned parallel to the third direction.

The plurality of magnetic sensors comprises:
- a ninth magnetic sensor arranged in such a way that the first, seventh and ninth magnetic sensors are aligned, and
- a tenth magnetic sensor arranged in such a way that the second, eighth and tenth magnetic sensors are aligned and that the ninth and tenth magnetic sensors are aligned parallel to the third direction.

The plurality of magnetic sensors comprises:
- an eleventh magnetic sensor arranged in such a way that the third and eleventh magnetic sensors are aligned parallel to the second direction, and
- a twelfth magnetic sensor arranged in such a way that the fourth and twelfth magnetic sensors are aligned parallel to the second direction and that the eleventh and twelfth magnetic sensors are aligned parallel to the third direction.

The plurality of magnetic sensors comprises:
- a thirteenth magnetic sensor arranged in such a way that the third, eleventh and thirteenth magnetic sensors are aligned, and
- a fourteenth magnetic sensor arranged in such a way that the fourth, twelfth and fourteenth magnetic sensors are aligned and that the thirteenth and fourteenth magnetic sensors are aligned parallel to the third direction.

The plurality of magnetic sensors comprises:
- a fifteenth magnetic sensor arranged in such a way that the fifth and fifteenth magnetic sensors are aligned parallel to the second direction, and
- a sixteenth magnetic sensor arranged in such a way that the sixth and sixteenth magnetic sensors are aligned parallel to the second direction and that the fifteenth and sixteenth magnetic sensors are aligned parallel to the third direction.

The plurality of magnetic sensors comprises:
- a seventeenth magnetic sensor arranged in such a way that the fifth, fifteenth and seventeenth magnetic sensors are aligned, and
- an eighteenth magnetic sensor arranged in such a way that the sixth, sixteenth and eighteenth magnetic sensors are aligned and that the seventeenth and eighteenth magnetic sensors are aligned parallel to the third direction.

Another aspect of the invention relates to a method for magnetically detecting microscopic biological objects by means of a device according to the first aspect of the invention, the method comprising the following steps:
- detection of an event by a given magnetic sensor when said magnetic sensor carries out a measurement above a predetermined threshold;
- detection of a relevant event when at least two sensors spaced apart from each other along the first direction each detect an event in a predetermined temporal window;
- detection of a biological object when at least two sensors aligned with each other along the third direction each detect simultaneously an event.

BRIEF DESCRIPTION OF THE FIGURES

Other characteristics and advantages of the invention will become clear on reading the description that follows, with reference to the appended figures.

FIG. 1a schematically shows objects to detect comprising receivers and magnetic nanoparticles marked by specific antibodies of the receivers in such a way that the magnetic nanoparticles attach themselves to the objects to detect.

FIG. 1b schematically shows a side view of a device for magnetically detecting biological objects according to the prior art.

FIG. 5a schematically shows signals emitted by two magnetic sensors opposite a magnetic detection device according to an embodiment of the invention, in the case of an object to detect passing substantially at equal distance from the two magnetic sensors.

FIG. 5b schematically shows the signals emitted by two magnetic sensors opposite a magnetic detection device according to an embodiment of the invention, in the case of an object to detect passing closer to one magnetic sensor than the other.

FIG. 6 schematically shows the signals emitted by two successive magnetic sensors of a magnetic detection device according to an embodiment of the invention, making it possible to evaluate the velocity of an object to detect.

For greater clarity, identical or similar elements are marked by identical reference signs in all of the figures.

DETAILED DESCRIPTION OF AT LEAST ONE EMBODIMENT

Figure 2:
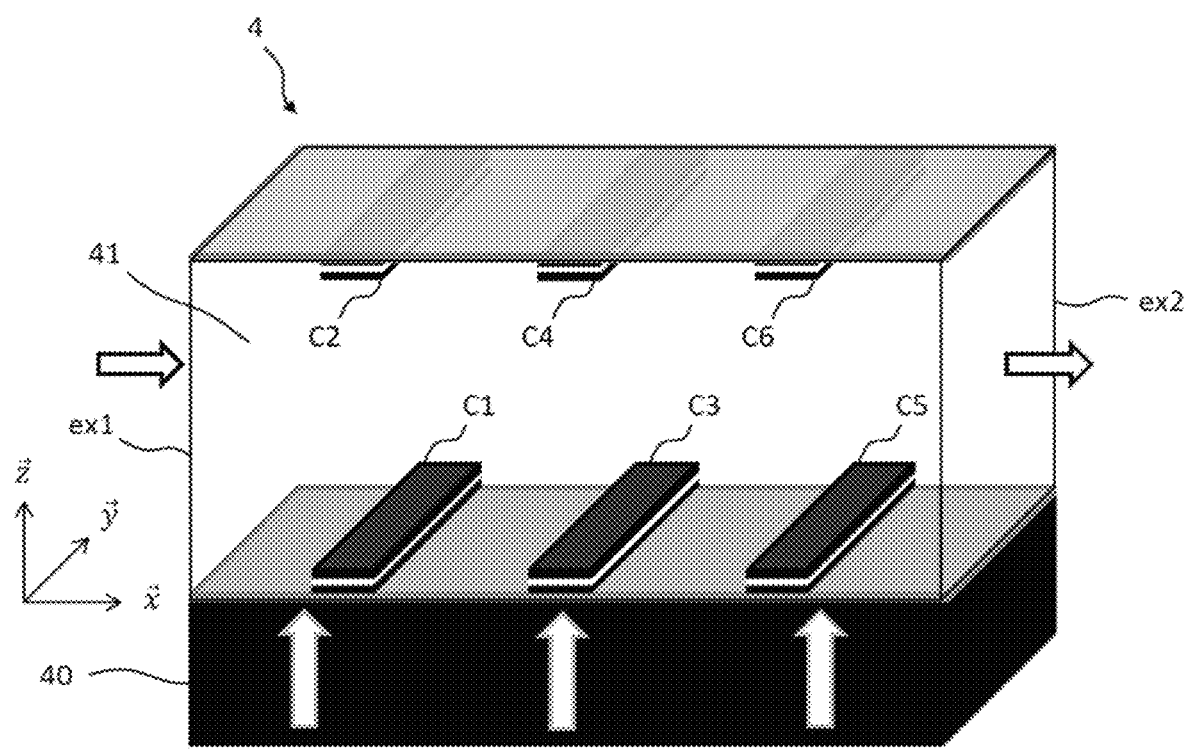
FIG. 2 schematically shows a device for magnetically detecting biological objects according to a first embodiment of the invention.

FIG. 2 schematically shows a device 4 for magnetically detecting biological objects according to a first embodiment of the invention, comprising:
- a microfluidic channel 41 extending between a first upstream end ex1 and a second downstream end ex2, the microfluidic channel having an inlet suited for a fluid on the side of its first upstream end ex1 and an outlet suited for a fluid on the side of its second downstream end ex2,
- a plurality of magnetic sensors arranged against an inner wall of the microfluidic channel 41, and
- a permanent magnet 40 arranged against an outer wall of the microfluidic channel 41, in such a way that the plurality of magnetic sensors is immersed in a magnetic field created by the permanent magnet 40.

At each point of the microfluidic channel 41, an orthogonal coordinate system is defined having:

a first direction $\vec{x}$ corresponding to a direction of flow within the microfluidic channel 41. In the case where the microfluidic channel 41 is rectilinear, the first and second ends ex1, ex2 are aligned along the first direction $\vec{x}$, which is fixed. In the case where the microfluidic channel 41 is not rectilinear but curved, the first direction $\vec{x}$ varies along the curvature of the microfluidic channel 41. The length of the microfluidic channel 41 is measured along the first direction $\vec{x}$.

a second direction $\vec{y}$ perpendicular to the first direction $\vec{x}$ and a third direction $\vec{z}$ perpendicular to the first and second directions $\vec{x}$, $\vec{y}$. The width of the microfluidic channel 41 is measured along the second direction $\vec{y}$ and the height of the microfluidic channel 41 is measured along the third direction $\vec{z}$. The permanent magnet 40 and the microfluidic channel 41 are aligned along the third direction $\vec{z}$. It is noted that the third direction $\vec{z}$ is invariant whatever the geometry, rectilinear or not, of the microfluidic channel 41. Only the first and second directions $\vec{x}$, $\vec{y}$ vary according to the geometry of the microfluidic channel 41.

Figure 8:
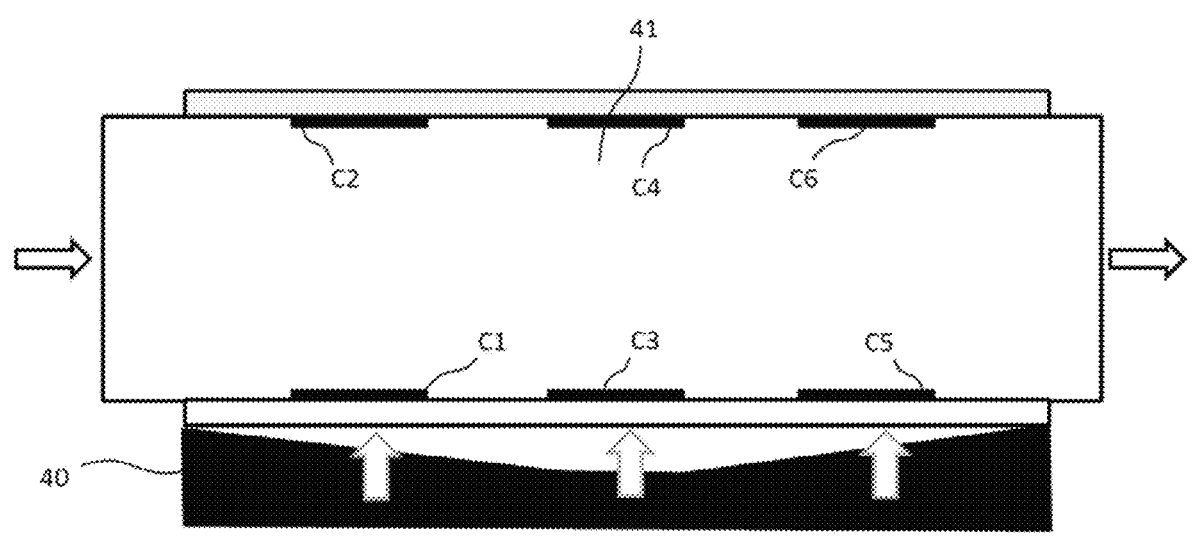
FIG. 8 schematically shows a preferred configuration of a permanent magnet of a magnetic detection device according to an embodiment of the invention.

It is sought to create by means of the permanent magnet 40 a magnetic field of which the field lines are perpendicular to the surface on which the magnetic sensors are arranged, that is to say here of which the field lines are colinear to the third direction $\vec{z}$. The permanent magnet 40 may be of substantially parallelepiped shape, as illustrated notably in FIGS. 2, 3, 4, with an upper surface substantially flat and in contact with an outer wall of the microfluidic channel 41, against an inner wall from which are arranged the magnetic sensors. As illustrated in FIG. 8, the upper face of the permanent magnet 40 may alternatively be hollowed out, in such a way as to have a trench of trapezoidal profile. This makes it possible to modify the magnetic field lines compared to the parallelepiped configuration, in order to improve and extend their perpendicularity, in such a way as to arrange a perfectly perpendicular field in a zone being able to include all the magnetic sensors of the plurality of magnetic sensors. Other shapes of permanent magnet, such as for example a permanent magnet having a hollowed out upper face in such a way as to have a trench of ellipsoidal profile, are also suitable.

Each magnetic sensor is preferentially of giant magnetoresistance GMR type or magnetoresistance with tunnel effect TMR type, because it is these technologies that have the best sensitivity and the smallest bulk. Alternatively, anisotropic magnetoresistance AMR magnetic sensors may be used but they are around five times less sensitive than GMR or TMR type sensors. According to another alternative, Hall effect magnetic sensors may be used but they are around 50 times less sensitive than GMR or TMR type sensors. According to yet another alternative, magnetic sensors with flux modulation (fluxgate sensors) may be used but they are bulkier and less sensitive than GMR or TMR type sensors.

Figure 7:
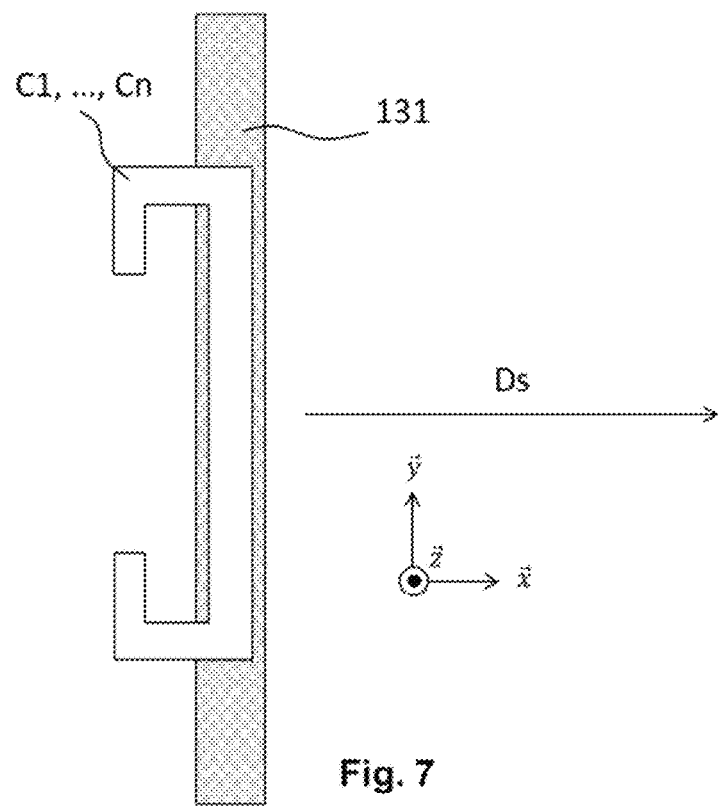
FIG. 7 schematically shows a preferred configuration of a magnetic sensor of a magnetic detection device according to an embodiment of the invention.

Magnetoresistive sensors, that is to say of GMT, TMR or AMR type, have a planar sensitivity, thus in this case a sensitivity in a plane parallel to the plane of the axes ($\vec{x}$, $\vec{y}$). Their axis of sensitivity is preferentially chosen in the direction of the microfluidic channel 41, that is to say in the first direction $\vec{x}$ in order that the sign of the signal that they emit depends on the position along the first direction $\vec{x}$ of the objects to detect. As illustrated in FIG. 7, each magnetoresistive sensor (referenced C1, . . . , Cn), of axis of sensitivity Ds, may have a C-shaped configuration, with a main arm in the second direction $\vec{y}$ extended on either side by first and second curved parts, hook shaped. The C-shaped configuration makes it possible to reduce magnetic noise. A current line 131 situated below or above the main arm of the magnetoresistive sensor furthermore makes it possible to apply a constant additional magnetic field to the magnetoresistive sensor in order to optimise its sensitivity.

The width of the microfluidic channel 41 is chosen as a function of the desired flow rate. A width in the second direction $\vec{y}$ greater than 100 μm could for example be chosen. The height of the microfluidic channel 41 is chosen as a function of the type of objects to detect. Thus, for objects to detect of several micrometres diameter, such as cells, the microfluidic channel 41 may have a height in the third direction $\vec{z}$ comprised between 20 μm and 30 μm. For objects to detect of diameter below a micrometre, the microfluidic channel 41 may rather have a height in the third direction $\vec{z}$ comprised between 2 μm and 10 μm.

Each magnetic sensor may have in the first direction $\vec{x}$ a maximum length comprised between 1 μm and 5 μm. Two consecutive magnetic sensors in the first direction or direction of flow $\vec{x}$ may be separated in this first direction $\vec{x}$ by a distance for example at least equal to 2 μm, or 5 μm, or 10 μm, and for example at the most equal to 100 μm, or 150 μm, or 200 μm. The spacing in length may be regular or irregular. An irregular spacing in length makes it possible to use the detection device according to an embodiment of the invention in a polyvalent manner, for objects to detect of different dimensions. Two consecutive magnetic sensors in the second direction or width $\vec{y}$ may be separated in this second direction $\vec{y}$ by a distance for example comprised between 20

μm and 100 μm. The spacing in width may be regular or irregular. A regular spacing in length and in width makes it possible to determine the trajectory of an object to detect more easily. The height spacing is for its part determined by the height of the microfluidic channel 41.

The plurality of magnetic sensors comprises at least:
a first magnetic sensor C1,
a second magnetic sensor C2 arranged opposite the first magnetic sensor C1, in such a way that the first and second magnetic sensors C1, C2 are aligned parallel to the third direction $\vec{z}$, and
a third magnetic sensor C3 arranged in such a way that the first and third magnetic sensors C1, C3 are aligned parallel to the first direction $\vec{x}$, or a fourth magnetic sensor C4 arranged in such a way that the first and fourth magnetic sensors are aligned parallel to the first direction x, the third and fourth magnetic sensors C3, C4 being arranged downstream of the first and second magnetic sensors C1, C2.

The first and second magnetic sensors C1, C2 belong to a first measurement plane normal to the first direction or direction of flow $\vec{x}$. When an object to detect progresses in the microfluidic channel 41 and arrives at the level of the first measurement plane and the first and second magnetic sensors C1, C2 which are facing each other on either side of the inner wall of the microfluidic channel 41, each magnetic sensor C1, C2 emits a signal which is all the stronger when it detects an important magnetism. The ratio of the signals emitted by the first and second magnetic sensors C1, C2 thus provides information on the height of the object within the microfluidic channel 41 at the moment of the measurement. This point is more particularly illustrated in FIGS. 5a and 5b. FIG. 5a schematically shows the signals emitted by two magnetic sensors opposite a magnetic detection device according to an embodiment of the invention, in the case of an object to detect passing substantially at equal distance from the two magnetic sensors. In this case, the two signals emitted are substantially of same amplitude and their ratio will be close to 1. FIG. 5b schematically shows the signals emitted by two magnetic sensors opposite a magnetic detection device according to an embodiment of the invention, in the case of an object to detect passing closer to one magnetic sensor than the other. In this case, the magnetic sensor closer to the object to detect emits a signal of greater amplitude than the magnetic sensor further away from the object to detect, and their ratio will be very different from 1. FIGS. 5a and 5b show in particular a shape of signal that corresponds to the case of an object to detect of magnetisation perpendicular to the plane of the magnetic sensors.

The third and fourth magnetic sensors C3, C4 belong to a second measurement plane normal to the first direction or direction of flow x. The second measurement plane lies downstream of the first measurement plane. The third and/or fourth magnetic sensors C3, C4, arranged downstream of the first and second magnetic sensors C1, C2, make it possible in combination with the latter to obtain information of flow velocity of an object to detect. This point is more particularly illustrated in FIG. 6, which schematically shows the signals emitted by two successive magnetic sensors of a magnetic detection device according to an embodiment of the invention, making it possible to evaluate the velocity of an object to detect. It involves in this case first and third magnetic sensors C1, C3 but it could also involve second and third magnetic sensors C2, C3 and generally speaking, depending on the number and the layout of the magnetic sensors of the plurality of magnetic sensors, other configurations are also possible. If there are three successive magnetic sensors or more, it is possible to use two non-consecutive magnetic sensors, for example two magnetic sensors at the ends, to increase or even to maximise the distance between the two magnetic sensors serving to calculate the velocity. It is also possible to calculate the velocity several times, from different binomials: such redundancy makes it possible to improve the precision of the result notably if the signals are noisy. Information of magnetisation of an object to detect is then obtained from the height and velocity information.

When the plurality of magnetic sensors comprises both the third and fourth magnetic sensors C3, C4, with the fourth magnetic sensor C4 arranged opposite the third magnetic sensor C3 in such a way that the third and fourth magnetic sensors C3, C4 are aligned parallel to the third direction $\vec{z}$, this further makes it possible to obtain, by the ratio of the signals emitted by the third and fourth magnetic sensors C3, C4, new information on the height of the object within the microfluidic channel 41 at the moment of the measurement.

The plurality of magnetic sensors may further comprise:
a fifth magnetic sensor C5 arranged in such a way that the first and fifth magnetic sensors C1, C5 are aligned parallel to the first direction and/or
a sixth magnetic sensor C6 arranged in such a way that the second and sixth magnetic sensors C2, C6 are aligned parallel to the first direction the fifth and sixth magnetic sensors C5, C6 being arranged downstream of the third and fourth magnetic sensors C3, C4.

The fifth and sixth magnetic sensors C5, C6 belong to a third measurement plane normal to the first direction or direction of flow $\vec{x}$. The third measurement plane lies downstream of the first and second measurement planes. The fifth and/or sixth magnetic sensors C5, C6, arranged downstream of the third and/or fourth magnetic sensors C3, C4 make it possible to improve the reliability of the device 4 by a detection of potential false positives. When a first detection signal has been emitted by at least one sensor of the first measurement plane, followed by a second detection signal emitted by at least one sensor of the second measurement plane, a first flow velocity is calculated from the distance separating the first and second measurement planes and the time interval separating the successive first and second detection signals. If at least one sensor of the third measurement plane emits in its turn a third detection signal, a second flow velocity is calculated from the distance separating the second and third measurement planes and the time interval separating the second and third successive detection signals. A detection of an object is then truly confirmed if the first and second flow velocities are compatible with each other, that is to say if the difference between the first and second velocities is less than or equal to 50%, or even 30%, of the average of the first and second velocities. If no sensor of the third measurement plane emits a third detection signal, or if it emits it too early or too late such that the second flow velocity is incompatible with the first flow velocity calculated previously, it is considered that no object has been detected.

When the plurality of magnetic sensors comprises at one and the same time the fifth and sixth magnetic sensors C5, C6, with the sixth magnetic sensor C6 arranged opposite the fifth magnetic sensor C5 in such a way that the fifth and sixth magnetic sensors C5, C6 are aligned parallel to the third direction $\vec{z}$, this further makes it possible to obtain, by the ratio of the signals emitted by the fifth and sixth magnetic sensors C5, C6, further new information on the height of the object within the microfluidic channel 41 at the moment of the measurement. Having available several items of height information derived from several binomials of opposite magnetic sensors makes it possible to obtain trajectory information of an object to detect, and notably to detect a trajectory non-parallel to the plane of the magnetic sensors, that is to say to the axes $\vec{x}$, $\vec{y}$ plane. The criterion chosen to define if the first and second flow velocities are compatible with each other or not may then be modified, adapted as a function of this trajectory information. Indeed, the velocity of an object varies as a function of its height within the microfluidic channel 41.

Figure 3:
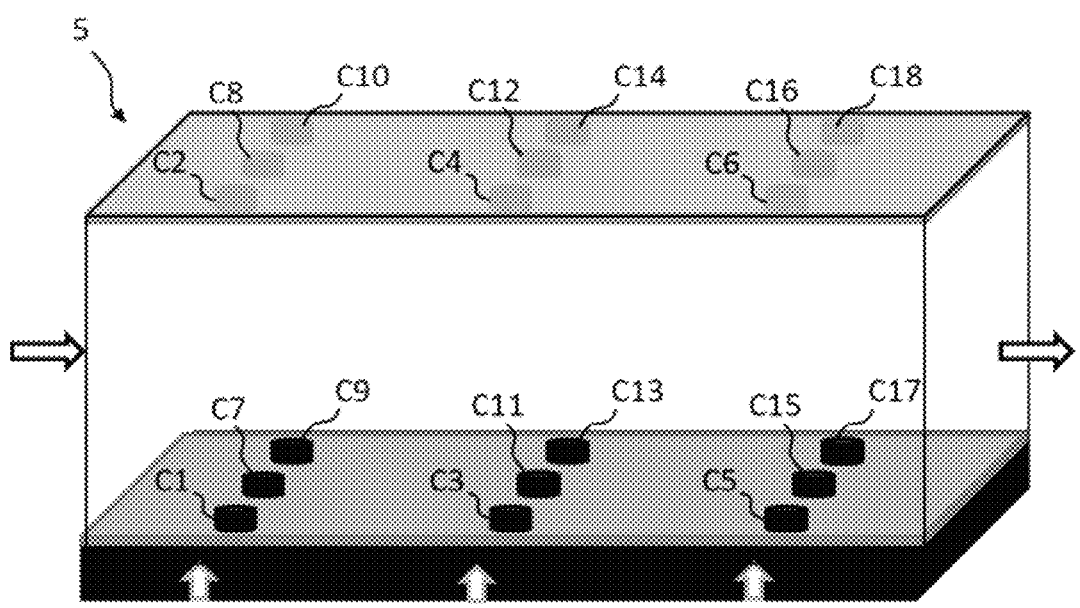
FIG. 3 schematically shows a side view of a device for magnetically detecting biological objects according to a second embodiment of the invention.

FIG. 3 schematically shows a device 5 for magnetically detecting biological objects according to a second embodiment of the invention. In addition to the magnetic sensors of the device 4 according to the first embodiment, according to each possible combination described previously, the plurality of magnetic sensors of the device 5 according to the second embodiment comprises at least:

a seventh magnetic sensor C7 arranged in such a way that the first and seventh magnetic sensors C1, C7 are aligned parallel to the second direction $\vec{y}$, and an eighth magnetic sensor C8 arranged in such a way that the second and eighth magnetic sensors C2, C8 are aligned parallel to the second direction $\vec{y}$. The seventh and eighth magnetic sensors C7, C8 are preferably aligned parallel to the third direction $\vec{z}$.

The seventh and eighth magnetic sensors C7, C8 belong to the first measurement plane, with the first and second magnetic sensors C1, C2. With four magnetic sensors in the first measurement plane, for each of the six binomials of two magnetic sensors out of four, namely: (C1, C2), (C7, C8), (C1, C7), (C2, C8), (C1, C8), (C2, C7), a ratio of the signals emitted is calculated and these six ratios make it possible to obtain shape information of an object to detect passing at the level of the first measurement plane. All the sensors of the plurality of sensors are preferably benefited from by calculating all the possible ratios, but it would alternatively be possible to only calculate a part of the possible ratios. This shape information, in addition to the magnetisation information, is particularly useful to enable the detection of small objects, such as proteins, with good specificity, that is to say without confusing them with a free magnetic nanoparticle or an aggregate of free magnetic nanoparticles. Indeed, since few magnetic nanoparticles can attach themselves onto a small object, for example only one, two or three, it may have the same magnetisation as a free magnetic nanoparticle or as an aggregate of free nanoparticles. In the second embodiment where additional shape information of the object to detect is sought, the height of the microfluidic channel 41 and of each magnetic sensor, as well as the spacing in length and in width between the magnetic sensors, are preferably less than 30 times the size of the object to detect, even more preferentially less than 20 times the size of the object to detect. This allows that a same object can effectively be detected simultaneously by several magnetic sensors.

In addition to the seventh and eighth magnetic sensors C7, C8, the plurality of magnetic sensors according to the second embodiment may also comprise:

a ninth magnetic sensor C9 arranged in such a way that the first, seventh and ninth magnetic sensors C1, C7, C9 are aligned, and a tenth magnetic sensor C10 arranged in such a way that the second, eighth and tenth magnetic sensors C2, C8, C10 are aligned. The ninth and tenth magnetic sensors C9, C10 are preferably aligned parallel to the third direction $\vec{z}$.

The ninth and tenth magnetic sensors C9, C10 belong to the first measurement plane, with the first, second, seventh and eighth magnetic sensors C1, C2, C7, C8. With six sensors in the first measurement plane, for each of the fifteen binomials of two magnetic sensors out of six, namely, in addition to the six binomials listed previously: (C1, C9), (C1, C10), (C2, C9), (C2, C10), (C7, C9), (C7, C10), (C8, C9), (C8, C10), (C9, C10), a ratio of the signals emitted is calculated and these fifteen ratios make it possible to obtain shape information of an object to detect passing at the level of the first measurement plane, more precise than with only four sensors and six ratios. All the sensors of the plurality of sensors are preferably benefitted from by calculating all the possible ratios, but alternatively it could be possible to only calculate a part of the possible ratios.

In addition to the third and fourth magnetic sensors C3, C4, the plurality of magnetic sensors according to the second embodiment may also comprise:

an eleventh magnetic sensor C11 arranged in such a way that the third and eleventh magnetic sensors C3, C11 are aligned parallel to the second direction $\vec{y}$, and a twelfth magnetic sensor C12 arranged in such a way that the fourth and twelfth magnetic sensors C4, C12 are aligned parallel to the second direction $\vec{y}$. The eleventh and twelfth magnetic sensors C11, C12 are preferably aligned parallel to the third direction $\vec{z}$.

The eleventh and twelfth magnetic sensors C11, C12 belong to the second measurement plane, with the third and fourth magnetic sensors C3, C4. In the same way as for the first measurement plane, for each of the six binomials of two magnetic sensors out of the four magnetic sensors of the second measurement plane, a ratio of the signals emitted is calculated and these six ratios make it possible to obtain shape information of an object to detect passing at the level of the second measurement plane. Shape information is thus obtained of the object to detect in the second measurement plane, in addition to that already obtained in the first measurement plane.

In addition to the eleventh and twelfth magnetic sensors C11, C12, the plurality of magnetic sensors according to the second embodiment may also comprise:

a thirteenth magnetic sensor C13 arranged in such a way that the third, eleventh and thirteenth magnetic sensors C3, C11, C13 are aligned, and a fourteenth magnetic sensor C14 arranged in such a way that the fourth, twelfth and fourteenth magnetic sensors C4, C12, C14 are aligned. The thirteenth and fourteenth magnetic sensors C13, C14 are preferably aligned parallel to the third direction $\vec{z}$.

The thirteenth and fourteenth magnetic sensors C13, C14 belong to the second measurement plane, with the third, fourth, eleventh and twelfth magnetic sensors C3, C4, C11, C12. In the same way as for the first measurement plane, for each of the fifteen binomials of two magnetic sensors out of the six magnetic sensors of the second measurement plane, a ratio of the signals emitted is calculated and these fifteen ratios make it possible to obtain shape information of an object to detect passing at the level of the second measurement plane, more precise than with only four sensors and six ratios.

In addition to the fifth and sixth magnetic sensors C5, C6, the plurality of magnetic sensors according to the second embodiment may also comprise:

a fifteenth magnetic sensor C15 arranged in such a way that the fifth and fifteenth magnetic sensors C5, C15 are aligned parallel to the second direction $\vec{y}$, and a sixteenth magnetic sensor C16 arranged in such a way that the sixth and sixteenth magnetic sensors C6, C16 are aligned parallel to the second direction $\vec{y}$. The fifteenth and sixteenth magnetic sensors C15, C16 are preferably aligned parallel to the third direction $\vec{z}$.

The fifteenth and sixteenth magnetic sensors C15, C16 belong to the third measurement plane, with the fifth and sixth magnetic sensors C5, C6. In the same way as for the first measurement plane and, if need be, the second measurement plane, for each of the six binomials of two magnetic sensors out of the four magnetic sensors of the third measurement plane, a ratio of the signals emitted is calculated and these six ratios make it possible to obtain shape information of an object to detect passing at the level of the third measurement plane. Shape information is thus obtained of the object to detect in the third measurement plane, in addition to that already obtained in the first measurement plane and, if need be, in the second measurement plane.

In addition to the fifteenth and sixteenth magnetic sensors C15, C16, the plurality of magnetic sensors according to the second embodiment may also comprise:

a seventeenth magnetic sensor C17 arranged in such a way that the fifth, fifteenth and seventeenth magnetic sensors C5, C15, C17 are aligned, and an eighteenth magnetic sensor C18 arranged in such a way that the sixth, sixteenth and eighteenth magnetic sensors C6, C16, C18 are aligned. the seventeenth and eighteenth sensors C17, C18 are preferably aligned parallel to the third direction $\vec{z}$.

The seventeenth and eighteenth magnetic sensors C17, C18 belong to the third measurement plane, with the fifth, sixth, fifteenth and sixteenth magnetic sensors C5, C6, C16, C17. In the same way as for the first and second measurement planes, for each of the fifteen binomials of two magnetic sensors out of the six magnetic sensors of the third measurement plane, a ratio of the signals emitted is calculated and these fifteen ratios make it possible to obtain shape information of an object to detect passing at the level of the third measurement plane, more precise than with only four sensors and six ratios.

Generally speaking, the denser the network of sensors according to the second embodiment, that is to say the more there are measurement planes and/or sensors per measurement plane, the higher the quality of the shape information of an object to detect.

The magnetic detection device according to any one of the embodiments of the invention may comprise an acquisition system, with one path by magnetic sensor. The acquisition frequency is chosen far greater than the inverse of the average time of passage of an object to detect in front of a magnetic sensor. "Average time" is taken to mean the time taken by an object circulating at average velocity to travel between 5 and 15 times, for example 10 times, a distance equal to the length of the magnetic sensor, in the first direction $\vec{x}$. This average time of passage may for example be 1 ms and in this case, the acquisition frequency may for example be chosen greater than or equal to 50 kHz.

The magnetic detection device according to any one of the embodiments may comprise a data processing system implementing for example the following steps:

the data processing system considers that a magnetic sensor detects an event when said magnetic sensor emits a signal that exceeds a threshold, set for example at two or three times the RMS noise;

the data processing system considers that a detected event is relevant if at least three magnetic sensors spaced apart in length, along the first direction $\vec{x}$, detect an event in a same temporal window, for example 10 ms and if said detections are temporally coherent with each other. For example, two detections will be considered temporally incoherent with each other if the detection by a downstream magnetic sensor takes place before the detection by an upstream magnetic sensor.

For each relevant event:

the data processing system determines a velocity of the object to detect from the time elapsed between two detections of said relevant event by two magnetic sensors spaced apart in length along the first direction $\vec{x}$;

the data processing system determines a height of the object to detect from the ratio of the signals emitted by at least one pair of two opposite magnetic sensors, spaced apart in height along the third direction $\vec{z}$, one of the two magnetic sensors of the pair having contributed to the relevance. Preferably, when a single magnetic sensor of a pair detects a signal, the data processing system eliminates the relevant event. It is estimated in fact that this probably corresponds to the case of a magnetic nanoparticle or an aggregate of nanoparticles not attached to an object to detect;

the data processing system determines a magnetic moment of the object to detect and an orientation of said magnetic moment, from the velocity and height determined beforehand. The data processing system determines more particularly the orientation of the magnetic moment from the asymmetry of the signals emitted by the two opposite magnetic sensors, which makes it possible to access the angle between the magnetisation of the object to detect and the plane of the magnetic sensors.

The data processing system may further compare the magnetic moment with a predetermined low level and a predetermined high level, and to consider that a valid biological object has effectively been detected as a function of the result of this comparison.

According to the second embodiment, the data processing system may further plot a trajectory of the object to detect and determine a shape of the object to detect. The data processing system may then compare the shape obtained with a predetermined shape obtained beforehand of the object to detect, for example contained in a database, and to consider that a searched for object has effectively been detected as a function of the result of this comparison. To determine an approximative shape of the object to detect, the data processing system uses the amplitudes of the signals corresponding to the set of relevant events detected at time t. It involves an inverse problem of which the solution is not unique a priori. Introducing one or more predetermined models, such as for example a ball or dumbbell model, generally makes it possible to determine the size and the orientation of the object to detect, and whether it corresponds or not to a predetermined shape.

Figure 4A:
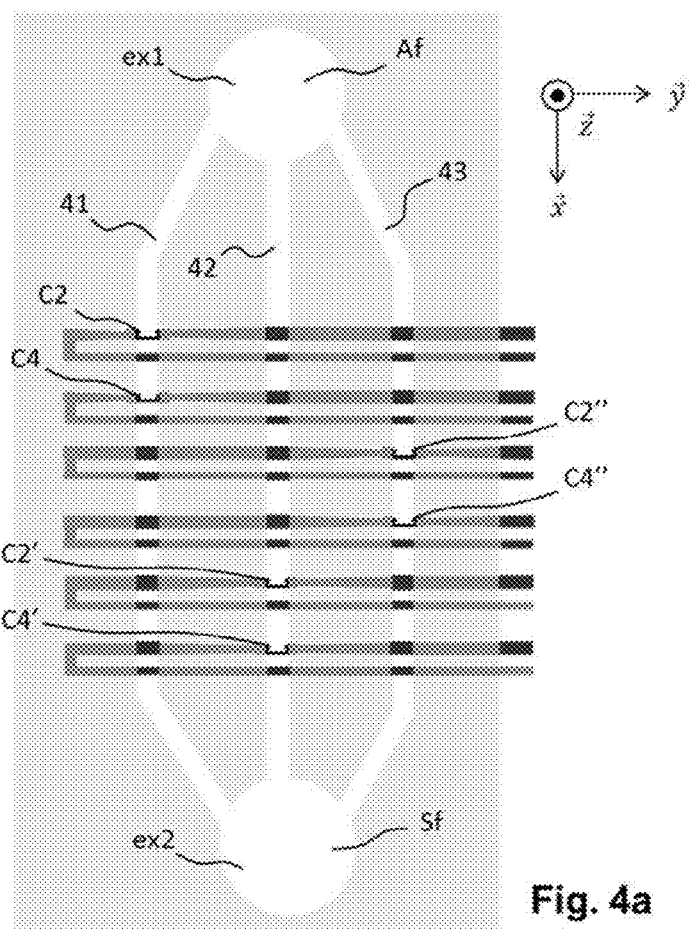
FIG. 4a schematically shows a top view of a device for magnetically detecting biological objects according to a first alternative of an embodiment of the invention.

FIG. 4a schematically shows a top view of a device for magnetically detecting biological objects according to a first alternative of any one of the embodiments of the invention. This first alternative is more particularly illustrated in FIG. 4a in the case of the first embodiment of FIG. 2 but it is also compatible with the second embodiment of FIG. 3. The detection device according to the first alternative comprises a plurality of microfluidic channels in parallel, with a common inlet Af suited for a fluid at the level of their first end ex1 and a common outlet Sf suited for a fluid at the level of their second end ex2. This makes it possible to increase the rate of detection of biological objects. In the example of FIG. 4a, the device according to the second alternative comprises, in addition to the microfluidic channel 41, second and third microfluidic channels 42, 43. The device according to the first alternative could only comprise two microfluidic channels in parallel, or instead four microfluidic channels or more in parallel.

Figure 4B:
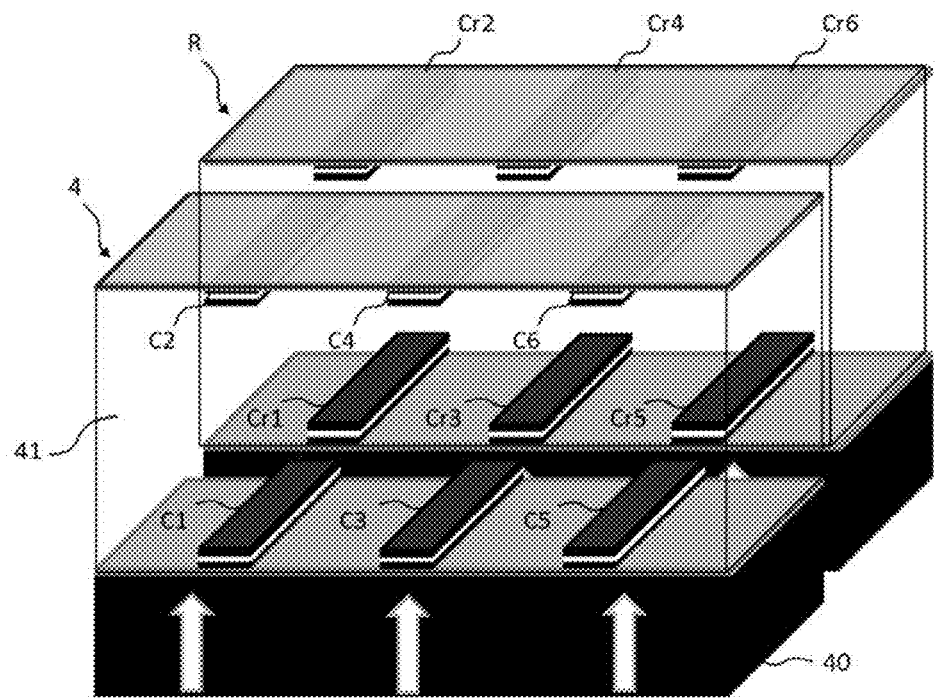
FIG. 4b schematically shows a magnetic detection device according to a second alternative of an embodiment of the invention.

FIG. 4b schematically shows a device for magnetically detecting biological objects according to a second alternative of any one of the embodiments of the invention. The second alternative is more particularly illustrated in FIG. 4b in the case of the first embodiment of FIG. 2 but it is also compatible with the second embodiment of FIG. 3. The second alternative is compatible with the first alternative. According to this second alternative, the following are provided:

a detection device according to any one of the embodiments, such as described previously, and a replica R of said detection device, arranged on the side of said detection device and according to the same spatial orientation as said detection device.

The replica R is identical to the detection device, except in what relates to the inlet and the outlet suited for a fluid: the replica may not comprise fluid because its channel is not intended to circulate a fluid. Each magnetic sensor of the detection device is associated with a "twin" magnetic sensor of the replica: in the particular example of FIG. 4b, the first magnetic sensor C1 is associated with the first twin magnetic sensor Cr1, etc. The first alternative makes it possible to subtract, for each twin magnetic sensor/magnetic sensor pair, the signal emitted by the twin magnetic sensor of the replica from the signal emitted by the magnetic sensor of the detection device, in order to eliminate errors induced by potential fluctuations in temperatures and/or exterior magnetic noise.

Generally speaking, the replica R according to the second alternative may not comprise a channel but simply:

a plurality of twin magnetic sensors, each twin magnetic sensor being associated with a magnetic sensor of the detection device, each twin magnetic sensor being arranged on a support projecting from the microfluidic channel 41, in the extension of the wall against which is arranged the magnetic sensor of the detection device with which it is associated; and a permanent magnet arranged in the extension of the permanent magnet of the detection device in such a way that the plurality of twin magnetic sensors see the same magnetic field as the plurality of magnetic sensors of the detection device, the permanent magnet of the replica being potentially one piece with the permanent magnet of the detection device.

Each magnetic sensor is connected to a reading electronic which may be integrated in the detection device, or not integrated in the detection device.

Figure 9A:
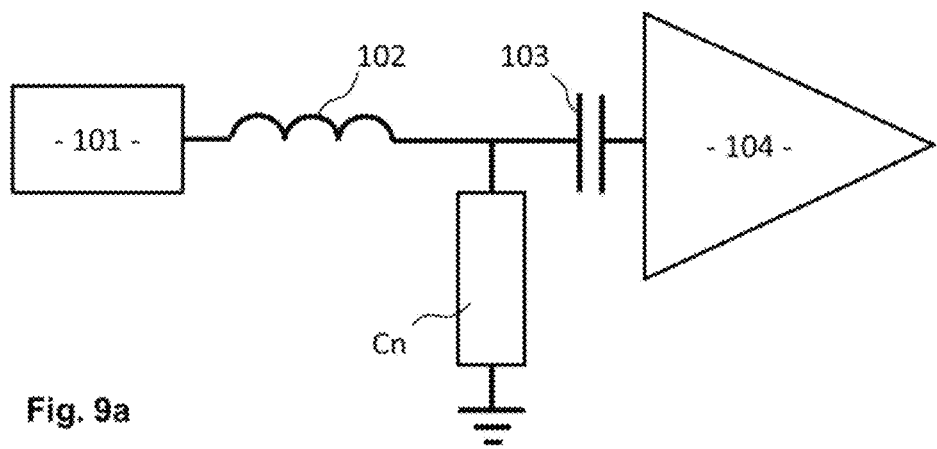
FIG. 9a schematically shows an example of reading electronic of a magnetic sensor of a magnetic detection device according to an embodiment of the invention or according to the first alternative.

FIG. 9a schematically shows an example of reading electronic of a magnetoresistive sensor (referenced Cn), of a magnetic detection device according to an embodiment of the invention or according to the first alternative. A voltage source DC 101 makes it possible to supply the magnetoresistive sensor Cn through an inductance 102. A variation in resistance due to a field created by an object to detect induces a voltage peak AC which is detected through a capacitance 103 then amplified by a low noise amplifier 104. The inductance 102 may be chosen to strongly attenuate the signals emitted by the magnetoresistive sensor, generally above 1 kHz, in order to avoid them disrupting the voltage source DC 101, thus such that:

$$\frac{2\pi L f}{R} > 10$$

with L the inductance value 102, f the inverse of the maximum passage time and R the resistance of the magnetoresistive sensor Cn. "Maximum passage time" is taken to mean the time taken by the slowest object to travel between 5 and 10 times, for example 10 times, a distance equal to the length of the magnetic sensor, in the first direction $\vec{x}$. The capacitance 103 may be chosen to not attenuate the signal. It may be taken as large as possible in keeping with the spatial constraints of the device. Values comprised between 1 µF and 100 µF, for example 10 µF, may be used.

Figure 9B:
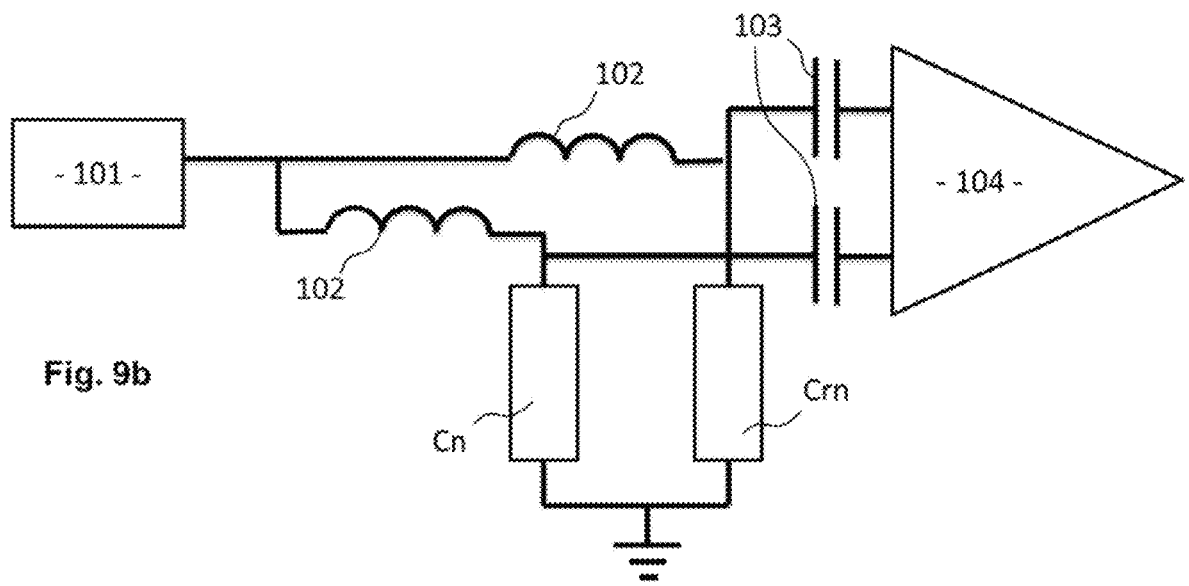
FIG. 9b schematically shows an example of reading electronic of a magnetic sensor of a magnetic detection device according to the second alternative of an embodiment of the invention.

FIG. 9b schematically shows an example of reading electronic of a pair of magnetoresistive sensor (referenced Cn)/twin magnetoresistive sensor (referenced Crn) of the magnetic detection device according to the second alternative of an embodiment of the invention. The inductances 102 and capacitances 103 are chosen in the same manner as described in relation with FIG. 9a. The amplifier 104 is configured in differential mode.

A detection device according to any one of the embodiments and alterative embodiments of the invention may be manufactured using microelectronic technologies, for example by means of the following steps:

The plurality of magnetic sensors being formed of a first group of magnetic sensors and a second group of magnetic sensors opposite the first group: manufacturing, by microelectronics technology, the first group of magnetic sensors in a first wafer or in a first part of a wafer, and the second group of magnetic sensors in a second wafer or in a second part of the wafer. The wafer, or the first and second wafers, may for example be made of silicon or glass.

Manufacturing a first half-channel on the first group of magnetic sensors, and manufacturing a second half-channel on the second group of magnetic sensors. The first half-channel may be produced by photolithography or mechanical cutting in a first support or in a first part of a support arranged on the first group of magnetic sensors. Similarly, the second half-channel may be produced by photolithography or mechanical cutting in a second support or in a second part of the support arranged on the second group of magnetic sensors. The support, or the first and second supports, may for example be made of oxide for example of silicon dioxide $SiO_2$ type, polymer or composite resin.

Piercing an inlet suited for a fluid at a first end of the first half-channel and/or the second half-channel, and piercing an outlet suited for a fluid at a second end of the first half-channel and/or the second half-channel.

Assembling the first and second half-channels in such a way as to obtain a complete channel and in such a way that the first group of magnetic sensors is arranged opposite the second group of magnetic sensors.

Producing a contact pick-up for each magnetic sensor of the plurality of magnetic sensors.

Each magnetic sensor may be passivated, for example with alumina or silicon nitride $Si_3N_4$, for example over a thickness of at least 200 nm. This makes it possible to protect each magnetic sensor against destruction by a fluid, for example a biological fluid, circulating later in the microfluidic channel. The first and second half-channels are then manufactured on the passivation material of the magnetic sensors.

Figures 10A, 10B:
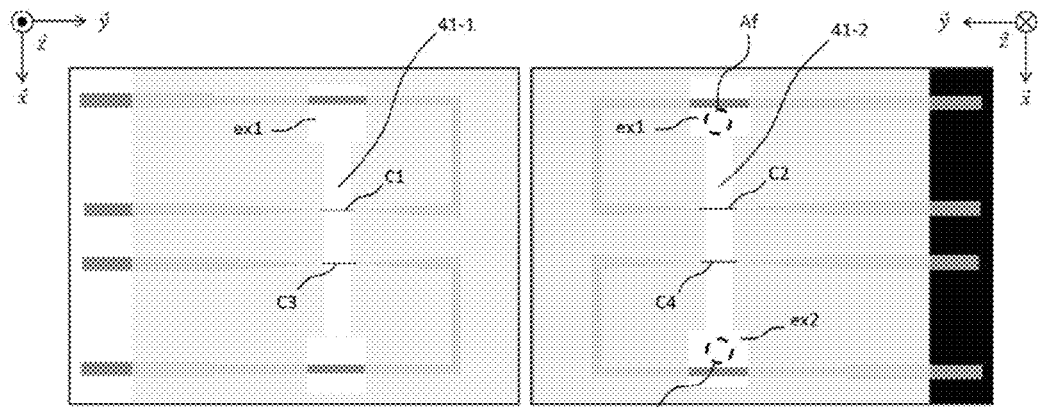
FIG. 10a schematically shows a top view of a first half-channel of a magnetic detection device according to an embodiment of the invention.
FIG. 10b schematically shows a bottom view of a second half-channel of a magnetic detection device according to an embodiment of the invention.
Figure 10C:
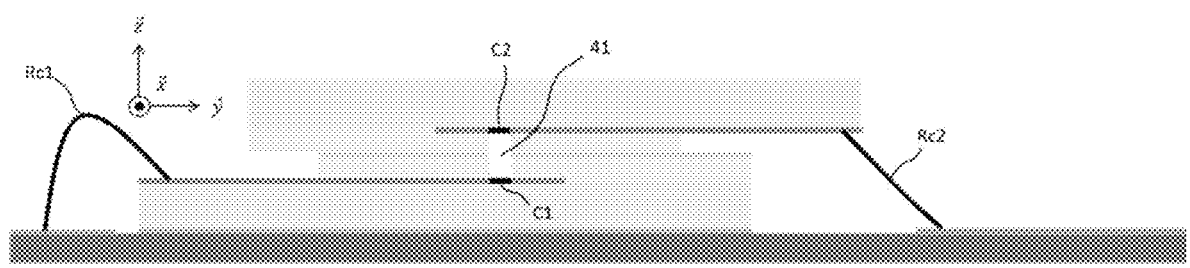
FIG. 10*c* schematically shows a sectional view of a magnetic detection device according to an embodiment of the invention, comprising the first and second half-channels of FIGS. 10*a* and 10*b*, assembled.
Figure 10D:
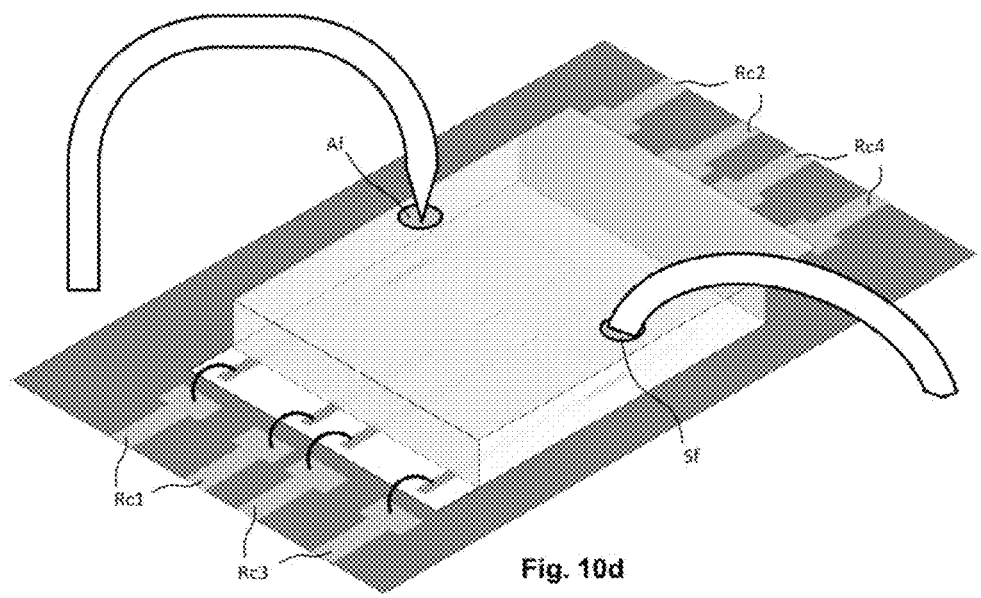
FIG. 10*d* schematically shows a perspective view of the magnetic detection device of FIG. 10*c*, showing notably an inlet and an outlet suited for a fluid.

FIG. 10a schematically shows a top view of a first half-channel 41-1 comprising first and third magnetic sensors C1, C3. FIG. 10b schematically shows a bottom view of a second half-channel 41-2 comprising second and fourth magnetic sensors C2, C4. FIG. 10b also shows an inlet Af suited for a fluid at the first end ex1 of the second half-channel 41-2 and an outlet Sf suited for a fluid at the second end ex2 of the second half-channel 41-2. FIG. 10c schematically shows a sectional view of an assembly of the first and second half-channels 41-1, 41-2 of FIGS. 10a and 10b, so as to form a microfluidic channel 41. FIG. 10c also shows a first contact pick-up Rc1 of the first magnetic sensor C1 and a second contact pick-up Rc2 of the second magnetic sensor C2. FIG. 10d schematically shows a perspective view of the device of FIG. 10c. FIG. 10d particularly shows the inlet Af suited for a fluid and the outlet Sf suited for a fluid, the first and second contact pick-ups Rc1, Rc2 as well as a third contact pick-up Rc3 of the third magnetic sensor C3 and a fourth contact pick-up Rc4 of the fourth magnetic sensor C4.

The invention claimed is:

1. A device for magnetically detecting microscopic biological objects comprising:
    a microfluidic channel extending between a first upstream end and a second downstream end, the microfluidic channel having an inlet arranged for a fluid on a side of the first upstream end of the microfluidic channel and an outlet arranged for the fluid on a side of the second downstream end of the microfluidic channel, the microfluidic channel having a length in a first direction of flow, a width in a second direction perpendicular to the first direction and a height in a third direction perpendicular to the first and second directions;
    a plurality of magnetic sensors arranged against an inner wall of the microfluidic channel; and
    a permanent magnet arranged against an outer wall of the microfluidic channel, in such a way that the plurality of magnetic sensors is immersed in a magnetic field created by the permanent magnet;
    wherein the plurality of magnetic sensors comprises:
    a first magnetic sensor;
    a second magnetic sensor opposite the first magnetic sensor in such a way that the first and second magnetic sensors are aligned parallel to the third direction;
    a third magnetic sensor arranged in such a way that the first and third magnetic sensors are aligned parallel to the first direction; the third magnetic sensor being arranged downstream of the first and second magnetic sensors;
    a data processing system configured to determine a velocity of a microscopic biological object detected from the time elapsed between two detections of a relevant event by two sensors aligned parallel to the first direction and to determine a height of the microscopic biological object detected from the ratio of the signals emitted by at least one pair of opposite sensors.

2. The device according to claim 1, wherein the plurality of magnetic sensors comprises a fourth magnetic sensor arranged in such a way that the second and fourth magnetic sensors are aligned parallel to the first direction, the fourth magnetic sensor being arranged downstream of the first and second magnetic sensors; the third and fourth magnetic sensors being aligned parallel to the third direction.

3. The device according to claim 1, wherein the plurality of magnetic sensors comprises a fifth magnetic sensor arranged in such a way that the first and fifth magnetic sensors are aligned parallel to the first direction; the fifth magnetic sensor being arranged downstream of the third and fourth magnetic sensors.

4. The device according to claim 3, wherein the plurality of magnetic sensors comprises a sixth magnetic sensor arranged in such a way that the second and sixth magnetic sensors are aligned parallel to the first direction, the sixth magnetic sensor being arranged downstream of the third and fourth magnetic sensors; the fifth and sixth magnetic sensors being aligned parallel to the third direction.

5. The device according to claim 1, wherein the plurality of magnetic sensors comprises:
    a seventh magnetic sensor arranged in such a way that the first and seventh magnetic sensors are aligned parallel to the second direction, and
    an eighth magnetic sensor arranged in such a way that the second and eighth magnetic sensors are aligned parallel to the second direction and that the seventh and eighth magnetic sensors are aligned parallel to the third direction.

6. The device according to claim 5, wherein the plurality of magnetic sensors comprises:
    a ninth magnetic sensor arranged in such a way that the first, seventh and ninth magnetic sensors are aligned, and
    a tenth magnetic sensor arranged in such a way that the second, eighth and tenth magnetic sensors are aligned and that the ninth and tenth magnetic sensors are aligned parallel to the third direction.

7. The device according to claim 5, wherein the plurality of magnetic sensors comprises the third magnetic sensor and the fourth magnetic sensor, the third and fourth magnetic sensors being aligned parallel to the third direction, wherein the plurality of magnetic sensors comprises:
    an eleventh magnetic sensor arranged in such a way that the third and eleventh magnetic sensors are aligned parallel to the second direction, and
    a twelfth magnetic sensor arranged in such a way that the fourth and twelfth magnetic sensors are aligned parallel to the second direction and that the eleventh and twelfth magnetic sensors are aligned parallel to the third direction.

8. The device according to claim 7, wherein the plurality of magnetic sensors comprises:
    a thirteenth magnetic sensor arranged in such a way that the third, eleventh and thirteenth magnetic sensors are aligned, and
    a fourteenth magnetic sensor arranged in such a way that the fourth, twelfth and fourteenth magnetic sensors are aligned and that the thirteenth and fourteenth magnetic sensors are aligned parallel to the third direction.

9. The device according to claim 5, wherein the plurality of magnetic sensors comprises a fifth magnetic sensor arranged in such a way that the first and fifth magnetic sensors are aligned parallel to the first direction and/or a sixth magnetic sensor arranged in such a way that the second and sixth magnetic sensors are aligned parallel to the first direction; the fifth and sixth magnetic sensors being arranged downstream of the third and fourth magnetic sensors, wherein the plurality of magnetic sensors comprises the fifth magnetic sensor and the sixth magnetic sensor, the fifth and sixth magnetic sensors being aligned parallel to the third direction, wherein the plurality of magnetic sensors comprises:
- a fifteenth magnetic sensor arranged in such a way that the fifth and fifteenth magnetic sensors are aligned parallel to the second direction, and
- a sixteenth magnetic sensor arranged in such a way that the sixth and sixteenth magnetic sensors are aligned parallel to the second direction and that the fifteenth and sixteenth magnetic sensors are aligned parallel to the third direction.

10. The device according claim 9, wherein the plurality of magnetic sensors comprises:
- a seventeenth magnetic sensor arranged in such a way that the fifth, fifteenth and seventeenth magnetic sensors are aligned, and
- an eighteenth magnetic sensor arranged in such a way that the sixth, sixteenth and eighteenth magnetic sensors are aligned and that the seventeenth and eighteenth magnetic sensors are aligned parallel to the third direction.

11. A method for magnetically detecting microscopic biological objects by means of the device according to claim 1, the method comprising:
- detecting an event by a given magnetic sensor when said magnetic sensor carries out a measurement above a predetermined threshold;
- detecting a relevant event when at least two sensors spaced apart from each other along the first direction each detect an event in a predetermined temporal window;
- detecting a microscopic biological object when at least two sensors aligned with each other along the third direction each detect simultaneously an event.

* * * * *